United States Patent
Grena et al.

(10) Patent No.: US 11,821,115 B2
(45) Date of Patent: Nov. 21, 2023

(54) STRETCHABLE SIGNAL PATH STRUCTURES FOR ELECTRONIC DEVICES

(71) Applicant: Apple Inc., Cupertino, CA (US)

(72) Inventors: Benjamin J. Grena, San Francisco, CA (US); Didio V. Gomes, Sunnyvale, CA (US); Joshua A. Hoover, Saratoga, CA (US); Seul Bi Kim, Sunnyvale, CA (US); David M. Kindlon, Felton, CA (US); Kevin T. Pham, Sugar Land, TX (US); Daniel A. Podhajny, San Jose, CA (US); Robert J. Rose, West Hempstead, NY (US); Andrew L. Rosenberg, Sunnyvale, CA (US); Miikka O. Tikander, Helsinki (FI)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 16/985,042

(22) Filed: Aug. 4, 2020

(65) Prior Publication Data

US 2021/0087719 A1 Mar. 25, 2021

Related U.S. Application Data

(60) Provisional application No. 62/904,774, filed on Sep. 24, 2019.

(51) Int. Cl.
*D03D 7/00* (2006.01)
*D03D 1/00* (2006.01)
(Continued)

(52) U.S. Cl.
CPC .............. *D03D 1/0088* (2013.01); *B32B 3/08* (2013.01); *B32B 5/02* (2013.01); *B32B 5/024* (2013.01);
(Continued)

(58) Field of Classification Search
CPC .......... D03D 15/56; D03D 7/00; D03D 11/00; D03D 17/00; D03D 1/0082; D03D 1/0088;
(Continued)

(56) References Cited

U.S. PATENT DOCUMENTS

| | | | |
|---|---|---|---|
| 3,240,656 A | * | 3/1966 | Faircloth ................ D03D 11/00 139/423 |
| 7,191,803 B2 | | 3/2007 | Orr et al. |

(Continued)

FOREIGN PATENT DOCUMENTS

| | | |
|---|---|---|
| CN | 1650057 A | 8/2005 |
| CN | 107257869 A | 10/2017 |

(Continued)

*Primary Examiner* — Matthew D Matzek
(74) *Attorney, Agent, or Firm* — Treyz Law Group, P.C.; Kendall P. Woodruff (57) ABSTRACT

A stretchable fabric signal path may include a conductive strand located between first and second outer fabric layers. The outer fabric layers may be formed from intertwined strands of elastic material. The conductive strand may have a wavy shape to accommodate stretching of the stretchable fabric signal path. First and second inner fabric layers may be located between the outer stretchable fabric layers. The inner fabric layers may be formed from intertwined strands of non-elastic material. The inner fabric layers may have strands that are intertwined with the outer fabric layers to serve as anchor points for maintaining the shape of the conductive strand as the stretchable fabric signal path expands and contracts. The outer fabric layers and inner fabric layers may be woven. The conductive strand may convey electrical signals such as audio signals, power signals, data signals, or other suitable signals.

20 Claims, 6 Drawing Sheets

(51) Int. Cl.
*B32B 5/02* (2006.01)
*B32B 3/08* (2006.01)
*D03D 11/00* (2006.01)
*D03D 17/00* (2006.01)
*H01B 7/06* (2006.01)
*D03D 15/56* (2021.01)

(52) U.S. Cl.
CPC .............. *D03D 7/00* (2013.01); *D03D 11/00* (2013.01); *D03D 15/56* (2021.01); *D03D 17/00* (2013.01); *H01B 7/06* (2013.01); *B32B 2250/02* (2013.01); *B32B 2250/03* (2013.01); *B32B 2250/04* (2013.01); *B32B 2262/02* (2013.01); *B32B 2262/0276* (2013.01); *B32B 2262/103* (2013.01); *B32B 2307/202* (2013.01); *B32B 2457/00* (2013.01); *D10B 2331/04* (2013.01); *D10B 2331/06* (2013.01); *D10B 2331/12* (2013.01)

(58) Field of Classification Search
CPC ............ B32B 2250/04; B32B 2262/02; B32B 2262/0207; B32B 2262/0215; B32B 5/08; B32B 2255/205; B32B 2262/0292; B32B 2262/062; B32B 2262/065; B32B 2262/101; B32B 2262/105; B32B 2262/106; B32B 2262/14; B32B 2307/206; B32B 2307/51; B32B 5/026; B32B 7/022; B32B 7/12; H05K 2201/029; H05K 2201/10287; H05K 1/038; H05K 1/0283; D10B 2331/10; D10B 2401/16
USPC ..................... 442/182–184, 239, 243–244
See application file for complete search history.

(56) References Cited

U.S. PATENT DOCUMENTS

| | | | |
|---|---|---|---|
| 9,554,465 B1 | 1/2017 | Liu et al. | |
| 10,011,925 B2 | 7/2018 | Kurahashi et al. | |
| 2006/0124193 A1* | 6/2006 | Orr | ...................... D03D 13/004 |
| | | | 139/421 |
| 2006/0259096 A1* | 11/2006 | Ayre | ................... A61M 60/871 |
| | | | 607/60 |
| 2008/0282665 A1 | 11/2008 | Speleers | |
| 2014/0340857 A1 | 11/2014 | Hsu et al. | |
| 2017/0268136 A1 | 9/2017 | Roh et al. | |
| 2019/0013275 A1* | 1/2019 | Sunshine | ............ H01L 23/5386 |

FOREIGN PATENT DOCUMENTS

| | | | |
|---|---|---|---|
| CN | 107429443 A | 12/2017 | |
| CN | 108885145 A | 11/2018 | |
| EP | 1661512 A1 | 5/2006 | |
| JP | S44022544 B | 9/1969 | |
| JP | S61098884 U | 6/1986 | |
| JP | H03503397 A | 8/1991 | |
| JP | H11302948 A | 11/1999 | |
| JP | 2011082050 A | 4/2011 | |
| JP | 2011241518 A | 12/2011 | |
| JP | 2012177210 A | 9/2012 | |
| JP | 2016516909 A | 6/2016 | |
| JP | 2018016036 A | 2/2018 | |
| JP | 2018080417 A | 5/2018 | |
| JP | 2020067989 A | 4/2020 | |
| WO | WO-2017031153 A1 * | 2/2017 | ............. D02G 3/441 |
| WO | 2018037855 A1 | 3/2018 | |
| WO | 2018181641 A1 | 10/2018 | |
| WO | 2019190592 A1 | 10/2019 | |

* cited by examiner

STRETCHABLE SIGNAL PATH STRUCTURES FOR ELECTRONIC DEVICES

This application claims the benefit of U.S. provisional patent application No. 62/904,774, filed Sep. 24, 2019, which is hereby incorporated by reference herein in its entirety.

FIELD

This relates generally to electronic devices, and, more particularly, to stretchable signal path structures for electronic devices.

BACKGROUND

Electronic devices may include components that move relative to one another and that are interconnected using signal lines on printed circuits or using conductive wires in cables. For example, a pair of headphones may include a cable that couples to an electronic device. A laptop may include a flexible printed circuit that routes signals between a base housing and a display housing that are coupled by a hinge.

It can be challenging to provide signal paths between components that move relative to one another. If care is not taken, the signal path may not have sufficient elasticity, may become damaged after repetitive use, and/or may restrict movement of an electronic device.

SUMMARY

An electronic device such as a wrist watch, audio cable, or other electronic device may include one or more stretchable fabric signal paths. A stretchable fabric signal path may include one or more conductive strands located between first and second outer fabric layers. The outer fabric layers may be formed from intertwined strands of elastic material. The conductive strand may have a wavy shape to accommodate stretching of the stretchable fabric signal path.

One or more inner fabric layers may be located between the outer stretchable fabric layers. The inner fabric layers may be formed from intertwined strands of non-elastic material. The inner fabric layers may have strands that are intertwined with the outer fabric layers to serve as anchor points for maintaining the shape of the conductive strand as the stretchable fabric signal path expands and contracts. The outer fabric layers and inner fabric layers may be woven. The conductive strand may convey electrical signals such as audio signals, power signals, data signals, or other suitable signals.

The conductive strand may form floats on the inner fabric layers. In some arrangements, a first float on a first inner fabric layer may at least partially overlap a second float on a second inner fabric layer. To create overlapping floats in this way, the conductive strand may turn back on itself between the first and second inner fabric layers. The additional length in the conductive strand needed to make these turns may help increase the amount by which the conductive strand can stretch.

DETAILED DESCRIPTION

Figure 1:
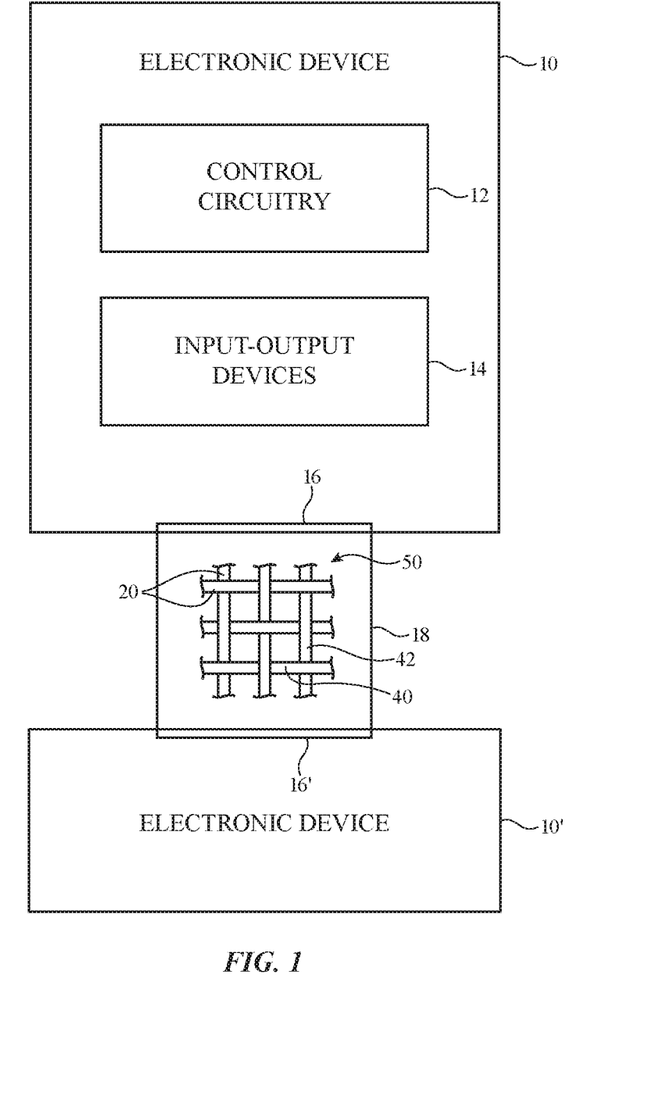
FIG. 1 is a schematic diagram of illustrative electronic equipment of the type that may include a stretchable fabric signal path in accordance with an embodiment.

A schematic diagram of illustrative electronic equipment that may be provided with stretchable fabric signal path structures is shown in FIG. 1. Electronic device 10 and electronic device 10' of FIG. 1 may be operated independently or may be coupled to each other. A device such as device 10 and/or device 10' may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a case, bag, watch band, or other accessory that operates in conjunction with one of these devices or other equipment, equipment that implements the functionality of two or more of these devices, or other electronic equipment. As an example, device 10 may be a portable device such as a cellular telephone or media player and device 10' may be an accessory such as a cover (sometimes referred to as a case or enclosure). Other configurations may be used for device 10 and/or device 10' if desired. The example of FIG. 1 is merely illustrative.

Electronic device 10 may have control circuitry 12. Control circuitry 12 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 12 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 14 may be used to allow data to be supplied to device 10 and to allow data to be provided from device 10 to external devices. Input-output devices 14 may include a display, buttons, joysticks, scrolling wheels, touch pads, key pads, keyboards, audio components such as microphones and speakers, tone generators, vibrators, cameras, sensors, light-emitting diodes and other status indicators, data ports, etc. Wireless circuitry in devices 14 may be used to transmit and receive radio-frequency wireless signals. Wireless circuitry may include antennas and radio-frequency transmitters and receivers operating in wireless local area network bands, cellular telephone bands, and other wireless communications bands.

A user can control the operation of device 10 by supplying commands through input-output devices 14 and may receive status information and other output from device 10 using the output resources of input-output devices 14. Control circuitry 12 may be used to run software on device 10 such as operating system code and applications. During operation of device 10, the software running on control circuitry 12 may use input-output devices 14 to gather user input and other input and can provide the user with visual output, audio output, and other output.

Device 10' may include the same circuitry as device 10 and/or may contain different circuitry. Devices 10 and 10' may include respective connections 16 and 16' and signal paths such as path 18. Connections 16 and 16' may be formed using solder, conductive adhesive, welds, connectors, and/or other structures for forming electrical and/or mechanical structures. Path 18 may be used to share input and output information between devices 10 and 10'. Portions of paths such as path 18 may be included in devices 10 and/or 10'. In some arrangements, the entirety of path 18 may be part of electronic device 10 and/or may be part of electronic device 10'.

Devices such as devices 10 and 10' may be used together. For example, the input resource of the input-output devices in device 10' may be used to gather input from a user. This user input may then be conveyed to device 10 over signal path 18 for use in controlling the operation of device 10. If, for example, device 10' includes a keyboard, a user may supply key press input to device 10' that is conveyed via path 18 (e.g., a path that is separate from device 10' and/or that is included in device 10') to device 10. Device 10 may also use the resources of device 10' to provide the user with output. For example, device 10 can supply output to device 10' over path 18 that instructs device 10' to turn on or off particular light-emitting diodes or other status indicators or that instructs device 10' to provide other visual and/or audio output for the user.

Signal paths between devices 10 and 10' and portions of signal paths 18 that are contained within devices 10 and 10' may be formed from stretchable fabric layers. These fabric layers may allow the length of signal path 18 to expand and contract and may accommodate bends (e.g., tight bends) in the structures that make up devices 10 and/or 10'.

For example, stretchable fabric signal path 18 may include fabric 50 with intertwined strands of material such as strands 20. In some arrangements, strands 20 include warp strands 42 extending along a first dimension and weft strands 40 extending along a second dimension that is orthogonal to the first dimension. Strands 20 may be single-filament strands (sometimes referred to as fibers or monofilaments), may be yarns or other strands that have been formed by intertwining multiple filaments (multiple monofilaments) of material together, or may be other types of strands (e.g., tubing that carries fluids such as gases or liquids). The strands may include extruded strands such as extruded monofilaments and yarn formed from multiple extruded monofilaments. Monofilaments for fabric 50 may include polymer monofilaments and/or other insulating monofilaments and/or may include bare wires and/or insulated wires. Monofilaments formed from polymer cores with metal coatings and monofilaments formed from three or more layers (cores, intermediate layers, and one or more outer layers each of which may be insulating and/or conductive) may also be used.

Strands 20 in fabric 50 may be formed from polymer, metal, glass, graphite, ceramic, natural materials as cotton or bamboo, or other organic and/or inorganic materials and combinations of these materials. Conductive coatings such as metal coatings may be formed on non-conductive material. For example, plastic yarns and monofilaments in fabric 50 may be coated with metal to make them conductive. Reflective coatings such as metal coatings may be applied to make yarns and monofilaments reflective. Yarns may be formed from a bundle of bare metal wires or metal wire intertwined with insulating monofilaments (as examples).

Strands 20 may be intertwined to form fabric 50 using intertwining equipment such as weaving equipment, knitting equipment, or braiding equipment. Intertwined strands may, for example, form woven fabric, knit fabric, braided fabric, etc. Conductive strands and insulating strands may be woven, knit, braided, or otherwise intertwined to form contact pads that can be electrically coupled to conductive structures in device 10 such as the contact pads of an electrical component. The contacts of an electrical component may also be directly coupled to an exposed metal segment along the length of a conductive yarn or monofilament.

Conductive and insulating strands may also be woven, knit, or otherwise intertwined to form conductive paths. The conductive paths may be used in forming signal paths (e.g., signal buses, power lines, etc.), may be used in forming part of a capacitive touch sensor electrode, a resistive touch sensor electrode, or other input-output device, or may be used in forming other patterned conductive structures. Conductive structures such as conductive strands in fabric 50 may be used in carrying power signals, digital signals, analog signals, sensor signals, control signals, data, input signals, output signals, or other suitable electrical signals.

Fabric 50 may, for example, include conductive strands of material that are coupled to electrical components in device 10 and/or device 10'. The conductive strands may serve as signal paths that carry signals between devices 10 and 10' and/or that carry signals between components in device 10 and/or between components in device 10'.

Figure 2:
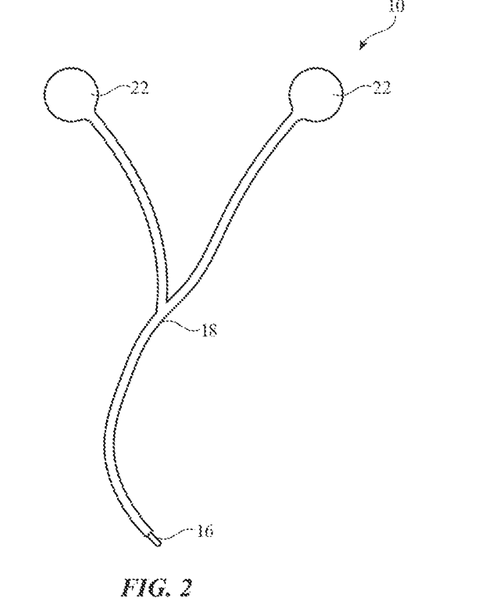
FIG. 2 is a front view of an illustrative electronic device such as a pair of headphones that may include a stretchable fabric signal path in accordance with an embodiment.

An example of an illustrative electronic device type that may be provided with a stretchable fabric signal path is shown in FIG. 2. As shown in FIG. 2, device 10 may be a pair of audio headphones. Device 10 may include a stretchable cable such as stretchable fabric cable 18. Earbuds 22 (e.g., earbuds that each contain one or more speakers) may be mounted at the ends of the right and left branches of cable 18. The end of cable 18 may be terminated by audio connector (plug) 16. Connector 16 may be, for example, a 3.5 mm audio plug that mates with a corresponding 3.5 mm audio jack in a media player, cellular telephone, portable computer, or other electronic device. Stretchable fabric signal path 18 may be used to convey signals (e.g., audio signals, power signals, ground signals, etc.) between the speakers and other electronic components in earbuds 22 and connector 16.

Figure 3:
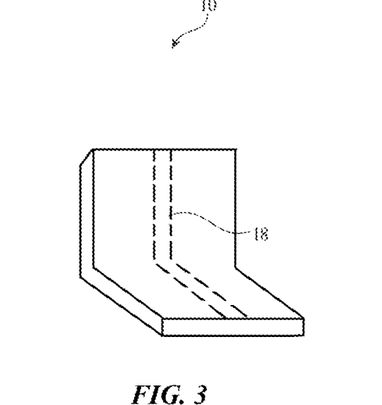
FIG. 3 is a perspective view of an illustrative item such as a seat that may include a stretchable fabric signal path in accordance with an embodiment.

FIG. 3 is a perspective view of an illustrative seat having a stretchable fabric signal path. As shown in FIG. 3, stretchable fabric signal path 18 follows the bends and contours of seat 10. Stretchable fabric signal path 18 may be used to convey signals between control circuitry and input-output circuitry or between other components in seat 10 of FIG. 3.

Figure 4:
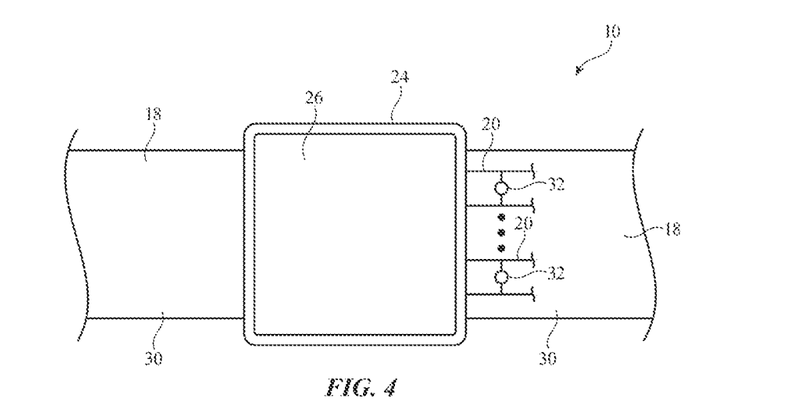
FIG. 4 is a top view of an illustrative electronic device such as a wrist watch that may include a stretchable signal path in accordance with an embodiment.

FIG. 4 is a top view of another illustrative electronic device that may have a stretchable fabric signal path. As shown in FIG. 4, device 10 may have a display such as display 26 and other electrical components mounted in a housing such as housing 24. Device 10 may be a portable electronic device such as a device that is mounted on a user's wrist, arm, leg, head, torso, or other body part. Device 10 may, for example, be a wrist-mounted device such as a wristwatch, a health monitoring device, a media player, a wireless key, or other electronic device and/or equipment that includes the functions of two or more of these devices or other suitable devices. Housing 24 (e.g., a watch housing in scenarios in which device 10 is a wristwatch) may be formed from metal, ceramic, plastic, glass, sapphire or other crystalline materials, and/or other suitable materials. Housing 24 may have a rectangular outline, may have an oval or circular shape, or may have other suitable shapes. Display 26 may be a liquid crystal display, an organic light-emitting diode display, or other suitable display.

Strap 30 may have portions attached to opposing sides of housing 24. Strap 30 may be coupled to pins or other structures that are attached to the exterior of housing 24 (as an example). A clasp formed from hook-and-loop fasteners or other suitable clasp may be used to secure strap 30 about the wrist or other body part of a user.

Strap 30 may include strands of material that are woven together. The strands of material that are woven to form strap 30 may be monofilaments and/or multifilament yarns. Strap 30 may contain insulating strands of material and/or conductive strands of material. Insulating strands may be formed from dielectric materials such as polymers. Conductive strands may be formed from metal wires or may be formed from one more conductive layers of material such as metal layers on polymer cores or other polymer layers. Conductive strands may also be formed by mixing conductive filaments with insulating filaments. Conductive strands may have insulating coatings.

If desired, strap 30 may contain electrical components such as components 32. Components 32 may include sensors, buttons, light-emitting diodes, batteries, antennas, integrated circuits, vibrators and other actuators, and/or other input-output devices. Strands 20 may include conductive strands for routing power and data signals between components 32 within strap 30 and between components such as component 32 in strap 30 and circuitry in housing 24.

Figure 5:
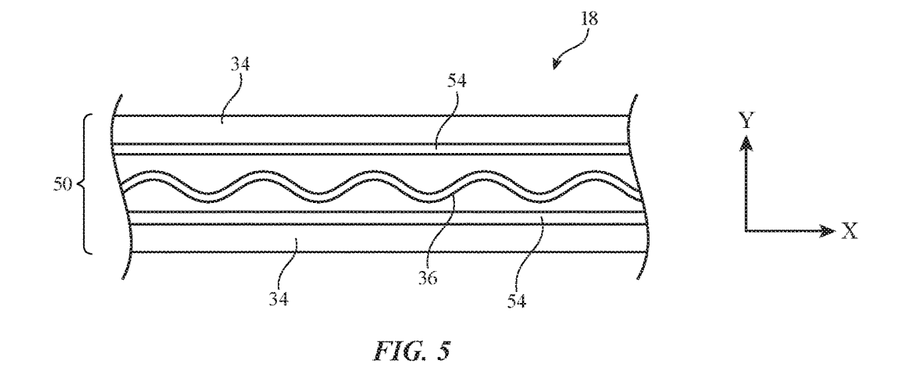
FIG. 5 is a cross-sectional side view of an illustrative stretchable fabric signal path in accordance with an embodiment.

FIG. 5 is a cross-sectional side view of an illustrative stretchable fabric signal path. As shown in FIG. 5, stretchable fabric signal path 18 may include fabric 50. Fabric 50 may include one or more outer fabric layers such as outer fabric layers 34 and one or more conductive strands such as conductive strand 36. Conductive strand 36 may be interposed between outer fabric layers 34. In some arrangements, outer fabric layers 34 are two fabric layers that are coupled together (e.g., using an intervening fabric layer, using individual strands that pass between the two fabric layers, using stitching, using adhesive, and/or using other attachment techniques). In other arrangements, outer fabric layers 34 are different portions of the same piece of fabric. FIG. 5 shows a gap between outer layers 34. If desired, outer layers 34 may be in contact with one another (e.g., may not be separated by a gap).

Conductive strands in path 18 such as conductive strand 36 may be used to convey electrical current (e.g., electrical signals) and may be formed from metal wires (e.g., wires formed from copper, silver, a silver-copper alloy, or other suitable metal) or may be formed from one more conductive layers of material such as metal layers on polymer cores or other polymer layers. Conductive strands may contain multiple thin wire strands that are woven or twisted together (e.g., a litz wire). Conductive strands may also be formed by mixing conductive filaments with insulating filaments. Conductive strands may have insulating coatings.

As shown in FIG. 5, conductive strand 36 may be located within fabric 50 between outer layers 34 and may follow a serpentine path. The wavy shape of conductive strand 36 allows conductive strand 36 to withstand stretching of fabric 50. This is, however, merely illustrative. If desired, conductive strand 36 may have other shapes (e.g., shapes with bends of different shapes or sizes, etc.). For example, in arrangements where fabric 50 is a braided fabric, conductive strand 36 may have a spring shape. Fabric 50 may be a woven fabric, a knit fabric, a braided fabric, or other suitable fabric. To allow stretching of signal path 18, outer layers 34 of fabric 50 may be formed from stretchable fabric (e.g., fabrics that include strands of elastic material).

If desired, fabric 50 may include one or more non-stretchable layers such as non-stretchable fabric layers 54. Non-stretchable fabric layers 54 may be formed from non-elastic strands (e.g., strands of polyester or other suitable material with relatively low elasticity). Non-stretchable fabric layers 54 may have no stretch or may have only a small amount of stretch (e.g., less stretch than outer fabric layers 34). Non-stretchable fabric layers 54 may have strands that are intertwined with conductive strand 36 and that are also intertwined with the strands of stretchable fabric layers 34. The locations where non-stretchable fabric layers 54 are intertwined with stretchable fabric layers 34 may serve as anchors to help maintain the shape of conductive strand 36 within fabric 50 while still allowing conductive strand 36 to expand and contract along its length.

Figure 6:
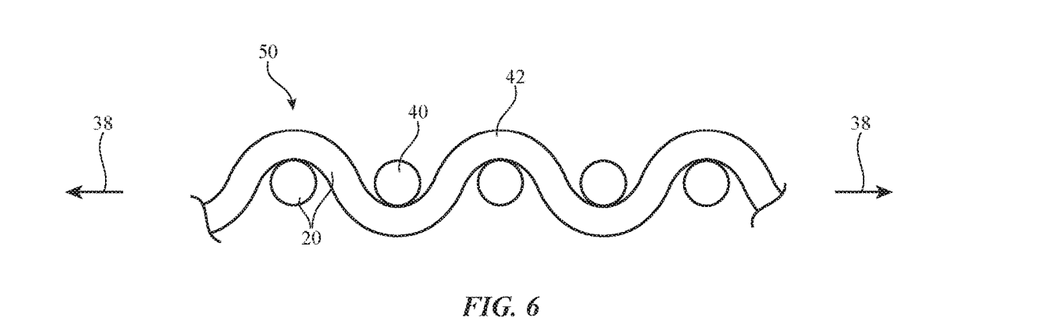
FIG. 6 is a cross-sectional side view of an illustrative fabric layer in an unstretched configuration in accordance with an embodiment.
Figure 7:
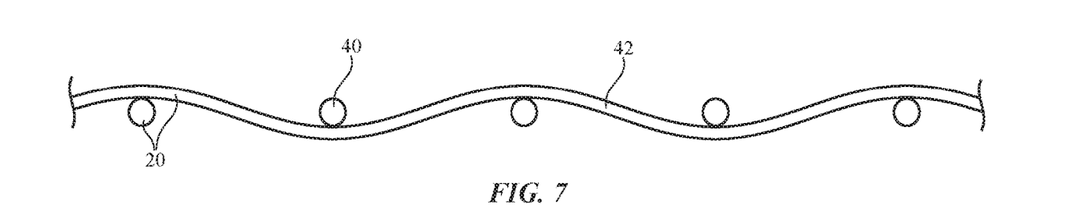
FIG. 7 is a cross-sectional side view of the fabric layer of FIG. 6 in a stretched configuration in accordance with an embodiment.

FIG. 6 is a cross-sectional side view of an illustrative stretchable fabric layer that may be used in a stretchable fabric signal path such as path 18. Fabric 50 of FIG. 6 may, for example, be used to form outer layers 34 of FIG. 5 and/or may be used to form other layers in fabric 50. Fabric 50 has strands 20 such as weft strands 40 and warp strands 42. Some or all of warp strands 42 (and, if desired, some or all of weft strands 40) may be formed from stretchable material such as stretchable polyurethane, spandex, silicone, other materials, or a combination of any two or more of these materials (e.g., a combination of spandex and polyester). Due to the presence of stretchable warp strands 42, fabric 50 may stretch when pulled in directions 38, as illustrated in FIG. 7. Stretchable strands such as warp strands 42 may be oriented to run around the user's wrist (e.g., in arrangements where flexible fabric signal path 18 forms a wrist strap such as strap 30 of FIG. 4). This allows a user to stretch strap 30 tightly around the user's wrist or other body part (e.g., to ensure that a satisfactory heart rate monitor signal is picked up by a heart rate monitor in device 10, etc.). If desired, fabric 50 may contain non-stretchable strands of material (e.g., polyester, etc.). Non-stretchable strands of material may, for example, be used to provide flexible fabric signal path 18 with strength and/or structure.

Illustrative examples of stretchable fabric signal paths are shown in FIGS. 8, 9, 10, and 11.

Figure 8:
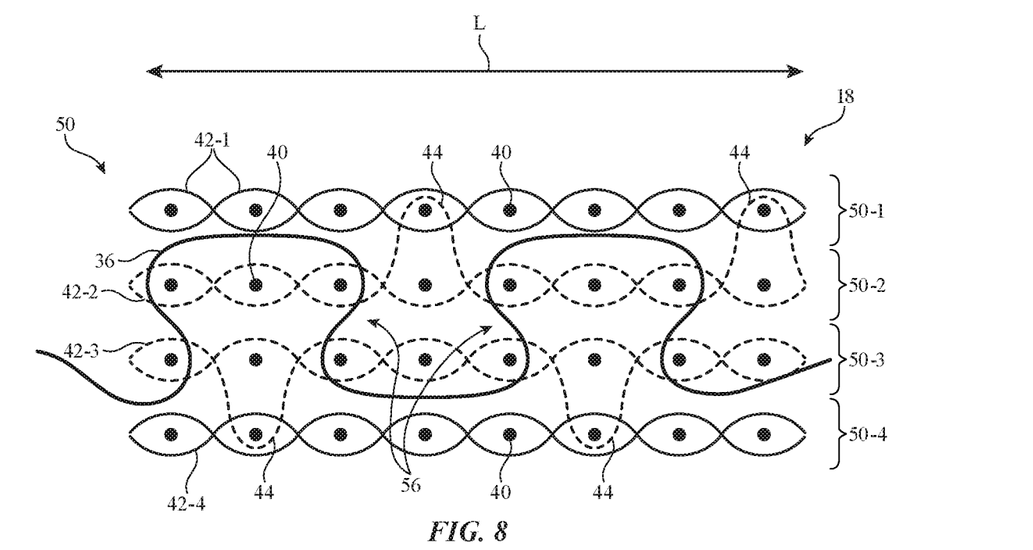
FIGS. 8, 9, 10, and 11 are cross-sectional side views of illustrative stretchable fabric signal paths having elastic strands, non-elastic strands, and one or more conductive strands in accordance with an embodiment.

As shown in FIG. 8, fabric 50 may include one or more fabric layers such as fabric layers 50-1, 50-2, 50-3, and 50-4. The use of four layers in fabric 50 is merely illustrative. If desired, fabric 50 may include greater or fewer than four layers of fabric. Fabric layer 50-1 may be formed from intertwined weft strands 40 and warp strands 42-1. Fabric layer 50-2 may be formed from intertwined weft strands 40 and warp strands 42-2. Fabric layer 50-3 may be formed from intertwined weft strands 40 and warp strands 42-3. Fabric layer 50-4 may be formed from intertwined weft strands 40 and warp strands 42-4.

Outer fabric layers such as layers 50-1 and 50-4 may be stretchable fabric layers (e.g., stretchable fabric layers of the type shown in FIGS. 6 and 7) and may be used to form outer fabric layers 34 of FIG. 5. For example, warp strands 42-1 (and, if desired, weft strands 40) of fabric layer 50-1 and warp strands 42-4 (and, if desired, weft strands 40) of fabric layer 50-4 may include strands of elastic material such as polyurethane, spandex, silicone, or other suitable material.

Inner fabric layers such as layers 50-2 and 50-3 may be non-stretchable fabric layers (e.g., layers with little or no stretch) and may be used to form fabric layers 54 of FIG. 5. For example, warp strands 42-2 (and, if desired, weft strands 40) of fabric layer 50-2 and warp strands 42-3 (and, if desired, weft strands 40) of fabric layer 50-3 may include strands of non-elastic material such as polyester or other suitable material.

As shown in FIG. 8, conductive strand 36 is interposed between fabric layers 50-1 and 50-4 and follows a serpentine path to allow strand 36 to withstand stretching of fabric 50. Conductive strand 36 may be intertwined (e.g., interwoven) with the layers of fabric 50 such as inner fabric layers 50-2 and 50-3. In particular, conductive strand 36 may extend in the warp direction and may pass over and under weft strands 40 of layers 50-2 and 50-3. This is, however, merely illustrative. If desired, conductive strand 36 may extend in the weft direction.

If desired, conductive stand 36 may only pass over a single weft strand 40 of one layer before moving to the adjacent layer, or conductive strand 36 may float over two or more adjacent weft strands 40 of one layer before moving to the adjacent layer. For example, as shown in FIG. 8, conductive strand 36 floats over three weft strands 40 in layer 50-2, then floats over three weft strands 40 in layer 50-3, then returns to layer 50-2 and floats over three weft strands 40 in layer 50-2, and this pattern may repeat along the length of fabric 50. If desired, conductive strand 36 may float over more or less than three weft strands 40 in each layer.

In the example of FIG. 8, the floats of conductive strand 36 on layer 50-2 partially overlap the floats of conductive strand 36 on layer 50-3. In particular, one or more of the weft strands 40 under a float on layer 50-2 may overlap one or more of the weft strands 40 under a float on layer 50-3. By having the floats on layer 50-2 at least partially overlap the floats on layer 50-3, conductive strand 36 needs additional length to turn back on itself (see, e.g., turns 56 in conductive strand 36). This additional length to accommodate turns 56 may help increase the amount by which conductive strand 36 can be stretched.

Inner non-stretchable fabric layers 50-2 and 50-3 may have strands that are intertwined with outer stretchable fabric layers 50-1 and 50-4. As shown in FIG. 8, for example, some of the warp strands 42-2 of layer 50-2 may pass over weft strands 40 of layer 50-2. Some of the warp strands 42-3 of layer 50-3 may pass over weft strands 40 of layer 50-4. The locations where non-stretchable strands of inner fabric layers are coupled to the strands of stretchable outer fabric layers may form anchor points 44 that help maintain the desired shape, structure, and/or location of conductive strand 36. In particular, as stretchable signal path 18 expands and contracts along the length L of fabric 50, anchor points 44 may help prevent conductive strand 36 from bunching or otherwise becoming disorganized within fabric 50.

Figure 9:
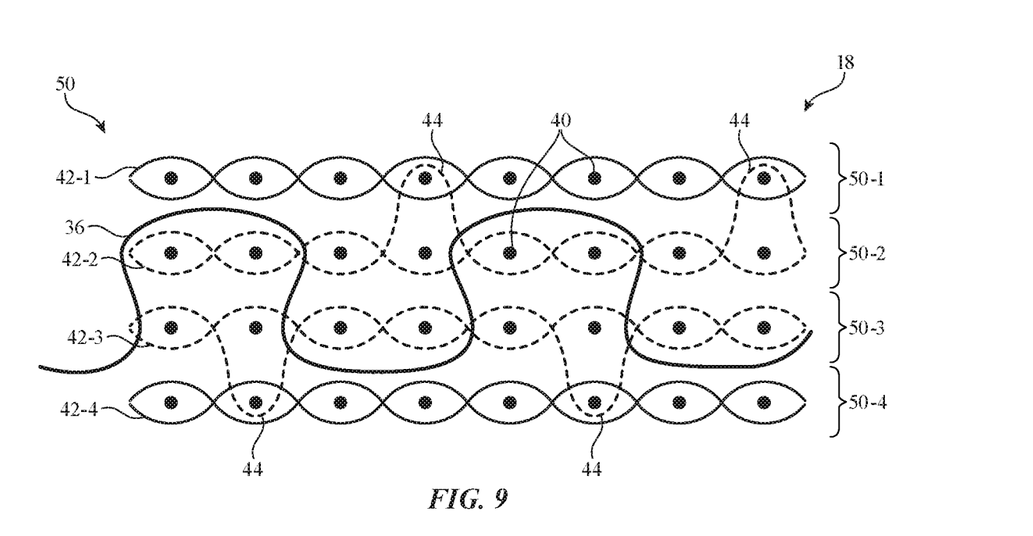

The example of FIG. 8 in which conductive strand 36 has floats that pass over three adjacent weft strands 40 is merely illustrative. In the example of FIG. 9, conductive strand 36 has floats on layers 50-2 and 50-3 that pass over two adjacent weft strands 40. In the FIG. 9 example, the floats on layer 50-2 do not overlap the floats on layer 50-3, but this is merely illustrative. If desired, the floats on layer 50-2 may at least partially overlap the floats on layer 50-3 so that conductive strand 36 turns back on itself as it passes between layers 50-2 and 50-3 (see, e.g., turns 56 of FIG. 8).

Figure 10:
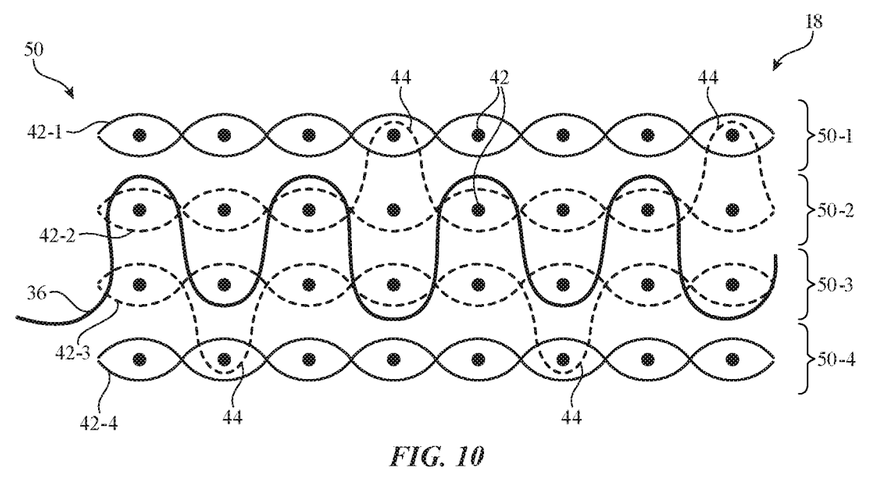

FIG. 10 shows an illustrative example in which conductive strand 36 does not have any floats on layer 50-2 or layer 50-3. Rather, conductive strand 36 passes over a single weft strand 40 in layer 50-2, then passes under a single weft strand 40 in layer 50-3, then returns to layer 50-2 in a repeating pattern.

Figure 11:
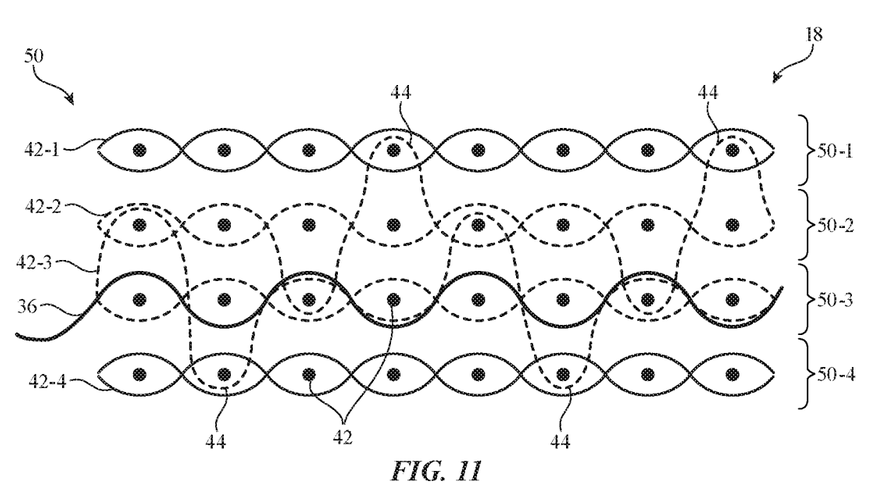

FIG. 11 shows an illustrative example in which conductive strand 36 is only intertwined (e.g., interwoven) with one layer of fabric. As shown in FIG. 11, conductive strand 36 is only intertwined with warp strands 42-3 and weft strands 40 of fabric layer 50-3. To help anchor conductive strand 36 to outer fabric layers 50-1 and 50-4, some of the warp strands 42-3 of layer 50-3 may be intertwined with layers 50-1, 50-2, and/or 50-4. The locations where warp strands 42-3 intertwine with the strands of layers 50-1 and 50-2 may form anchor points 44 for maintaining the shape of conductive strand 36.

Figure 12:
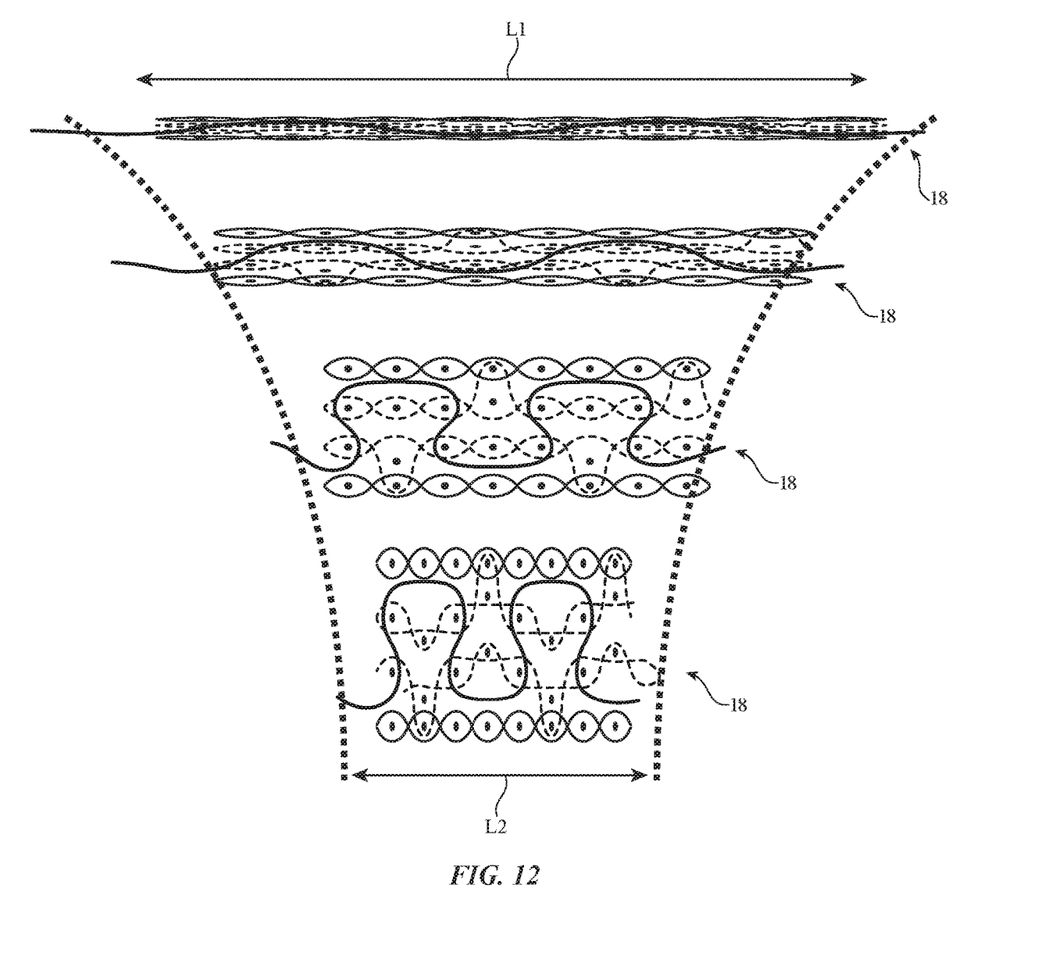
FIG. 12 is a diagram showing how a stretchable fabric signal path may expand and contract along its length in accordance with an embodiment.

FIG. 12 is a diagram illustrating how the shape of the strands in stretchable fabric signal path 18 may change under different amounts of stretch. At the top of FIG. 12, signal path 18 is stretched to its maximum length L1. FIG. 12 then shows signal path 18 contracting to progressively shorter lengths until it reaches its minimum length L2 shown at the bottom of FIG. 12. In some arrangements, L1 may be twice the length of L2 (e.g., signal path 18 may be capable of 100% stretch). Arrangements in which signal path 18 has greater or less than 100% stretch may also be used.

If desired, the strands of signal path 18 may be in a stretched state during formation of signal path 18. For example, warp strands 42 of the different layers in fabric 50 may be stretched on the weaving loom at their maximum length (e.g., warp strands 42 may be held under maximum tension). Similarly, conductive strand 36 may be stretched on the loom to its maximum length (e.g., may be straight) as it is intertwined with the layers of fabric 50. When fabric 50 is completed and removed from the loom, the strands may contract to the shape shown at the bottom of FIG. 12. As the inner and outer fabric layers collapse, anchor points 44 (e.g., anchor points of the type shown in FIGS. 8, 9, 10, and 11) may help keep the inner layers organized, which in turn helps maintain the desired wavy shape of conductive strand 36 (which is intertwined with the inner layers).

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to have control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made by those skilled in the art without departing from the scope and spirit of the described embodiments. The foregoing embodiments may be implemented individually or in any combination.

What is claimed is:

1. A fabric signal path, comprising:
   first and second outer fabric layers comprising stretchable strands;
   first and second non-stretchable inner fabric layers interposed between the first and second outer fabric layers and comprising non-stretchable warp strands; and
   a conductive strand interposed between the first and second outer fabric layers, wherein the conductive strand conveys electrical current and follows a serpentine path.

2. The fabric signal path defined in claim 1 wherein the conductive strand is intertwined with the first and second non-stretchable inner fabric layers.

3. The fabric signal path defined in claim 1 wherein the first and second outer fabric layers are woven.

4. The fabric signal path defined in claim 1 wherein the stretchable strands comprise a combination of spandex and polyester.

5. The fabric signal path defined in claim 1 wherein one of the non-stretchable warp strands of the first non-stretchable inner fabric layer is intertwined with the first outer fabric layer.

6. The fabric signal path defined in claim 5 wherein one of the non-stretchable warp strands of the second non-stretchable inner fabric layer is intertwined with the second outer fabric layer.

7. The fabric signal path defined in claim 1 wherein the conductive strand conveys signals selected from the group consisting of: audio signals, power signals, and data signals.

8. The fabric signal path defined in claim 1 wherein the fabric signal path has an unstretched length and a stretched length that is twice as long as the unstretched length.

9. The fabric signal path defined in claim 1 wherein the conductive strand has floats on the first and second non-stretchable inner fabric layers.

10. The fabric signal path defined in claim 9 wherein the floats comprise a first float on the first non-stretchable inner fabric layer and a second float on the second non-stretchable inner fabric layer and wherein the first float at least partially overlaps the second float so that the conductive strand turns back on itself between the first and second non-stretchable inner fabric layers.

11. A fabric, comprising:
first and second woven fabric layers comprising elastic strands;
a third woven fabric layer interposed between the first and second woven fabric layers, wherein the third woven fabric layer is non-stretchable and has a non-elastic warp strand that is intertwined with the first woven fabric layer; and
a metal strand interposed between the first and second woven fabric layers, wherein the metal strand conveys electrical current and is intertwined with the third woven fabric layer.

12. The fabric defined in claim 11 further comprising a fourth woven fabric layer interposed between the third woven fabric layer and the second woven fabric layer.

13. The fabric defined in claim 12 wherein the metal strand is intertwined with the fourth woven fabric layer.

14. The fabric defined in claim 13 wherein the metal strand has a first float on the third woven fabric layer and a second float on the fourth woven fabric layer that at least partially overlaps the first float.

15. The fabric defined in claim 11 wherein the metal strand comprises a copper litz wire.

16. A stretchable fabric cable, comprising:
first and second outer fabric layers comprising warp strands of a first material;
a non-stretchable inner fabric layer comprising warp strands of a second material that is different from the first material; and
an insulated metal wire that conveys electrical signals and is interposed between the first and second outer fabric layers, wherein the insulated metal wire is intertwined with the non-stretchable inner fabric layer and has a wavy shape.

17. The stretchable fabric cable defined in claim 16 wherein the insulated metal wire extends in the same direction as the warp strands of the first material.

18. The stretchable fabric cable defined in claim 16 wherein the first material is more elastic than the second material.

19. The stretchable fabric cable defined in claim 16 wherein the insulated metal wire has floats on the non-stretchable inner fabric layer.

20. The stretchable fabric cable defined in claim 16 wherein at least some of the warp strands of the second material are intertwined with the first outer fabric layer.

* * * * *